United States Patent [19]

Voorman et al.

[11] 3,758,885

[45] Sept. 11, 1973

[54] GYRATOR COMPRISING VOLTAGE-CONTROLLED DIFFERENTIAL CURRENT SOURCES

[75] Inventors: Johannes Otto Voorman; Arnoldus Biesheuvel, both of Emmasingel, Eindhoven, Netherlands

[73] Assignee: U. S. Philips Corporation, New York, N.Y.

[22] Filed: Oct. 5, 1972

[21] Appl. No.: 295,208

[30] Foreign Application Priority Data

Oct. 9, 1971 Netherlands ........................ 7113893

[52] U.S. Cl. .............. 333/80 T, 307/295, 330/30 D

[51] Int. Cl. ......................... H03h 7/44, H03h 11/00

[58] Field of Search ........................ 333/80 R, 80 T; 307/295

[56] References Cited

UNITED STATES PATENTS 3,400,335 9/1968 Orchard et al. ............ 333/80 R UX

FOREIGN PATENTS OR APPLICATIONS 1,762,832 9/1968 Germany .......................... 333/80 T 1,933,120 6/1969 Germany .......................... 333/80 T

*Primary Examiner*—Paul L. Gensler

*Attorney*—Frank R. Trifari

[57] ABSTRACT

The application relates to a gyrator which includes two voltage-controlled differential current sources. Two equivalent npn-transistors are used in one current source and two equivalent npn-transistors are used in the other current source. In addition steps have been taken in the gyrator to greatly reduce the D.C. offset currents at the input and output terminals.

3 Claims, 1 Drawing Figure

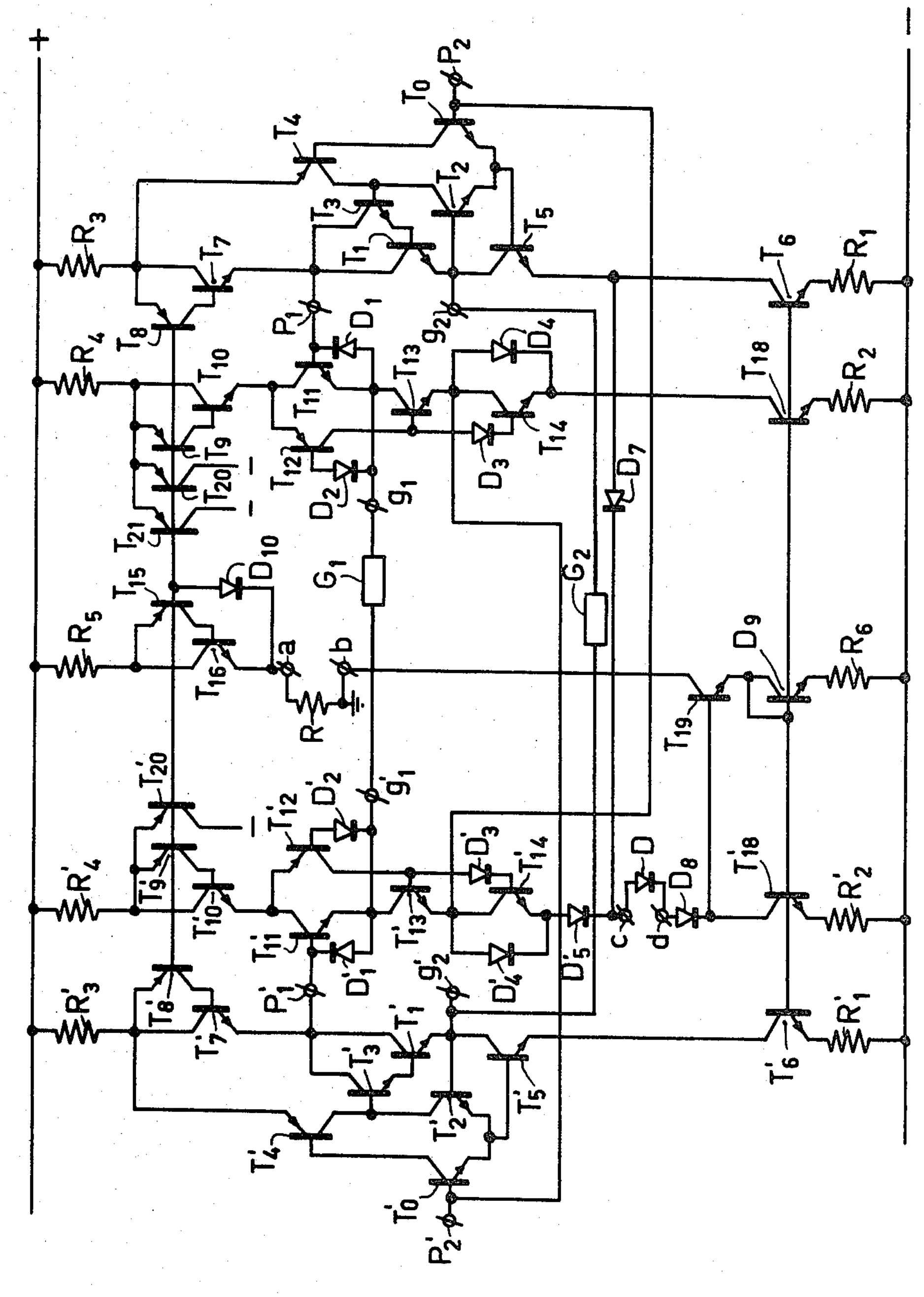

GYRATOR COMPRISING VOLTAGE-CONTROLLED DIFFERENTIAL CURRENT SOURCES

The invention relates to a gyrator which comprises a first and a second voltage-controlled differential current source, which current sources each include two input transistors and have two outputs, the control electrodes of the input transistors of the first differential current source also forming the inputs of the gyrator, whilst the control electrodes of the input transistors of the second differential current source also form the outputs of the gyrator, each of the outputs of the first differential current source being connected to an output of the gyrator, and each of the outputs of the second differential current source being connected to an input of the gyrator, whilst at least one of the two inputs and both outputs of the gyrator are connected via high-resistance current sources to points of constant potential, each of the input transistors having a first and a second main electrode. Gyrators are frequently used, for example, to replace the large and expensive coils of LC filter circuits, for when a capacitor is connected between the input terminals of the gyrator an inductance is produced between the output terminals of the gyrator. Thus an inductor may be simulated by means of a capacitor and a gyrator, the output terminals of the gyrator also being the connecting terminals of this inductor.

In a known gyrator of the said type the first main electrode of each of the input transistors of both differential current sources is constituted by the collector of the respective input transistor, the emitter of this transistor being its second main electrode. The input transistors of the first differential current source are of the npn-type and the input transistors of the second current source are of the pnp-type. The collectors of the two input transistors of each of the two differential current sources also are the outputs of the respective differential current source. The emitters of the input transistors of each of the differential current sources are interconnected via a gyration resistor. The emitters of all input transistors are connected via high-resistance current sources to points of constant potential. The high-resistance current sources which are connected to the control electrodes and the emitters of the input transistors of the first differential current source are coupled to a first current adjusting element, and the high-resistance current sources connected to the control electrodes and the emitters of the input transistors of the second differential current source are coupled to a second current adjusting element.

The aforedescribed known gyrator has the disadvantage that owing to the base signal currents and the variations in the base emitter voltages of the input transistors the voltage-to-current conversion in the two differential current sources is not exact, so that the gyrator also operates inexactly. In addition, the base currents give rise to D.C. offset currents at the input terminals of the gyrator, which also is undesirable. The currents of the first group of high-resistance current sources which are connected to the control electrodes and the emitters of the input transistors of the first differential current source may be made equal to one another by means of the first current adjusting element. The currents of the second group of high-resistance current sources which are connected to the control electrodes and the emitters of the input transistors of the second differential current source may be made equal to one another by means of the second current adjusting element. However, without additional adjustment it is very difficult to make the currents of the high-resistance current sources of the first and second groups equal to one another. This inequality of the currents also gives rise to a D.C. offset current at the input and output terminals of the gyrator.

It is an object of the invention to obviate the said disadvantages, and the invention is characterized in that, at least in the second differential current source, a high-resistance current source is connected in each of the circuits between the first main electrodes of the two input transistors and a supply point, whilst each of the first main electrodes is connected to the control electrode of a first transistor via a current feedback loop, the main current paths of the first transistors being included in the circuits between the second main electrodes of the input transistors and a supply point, whilst each of the outputs of the differential current source is connected via the main current path of at least one auxiliary transistor to the second main electrode of the associated input transistor, the main current paths of the auxiliary transistors being also included in the latter circuits, whilst the said high-resistance current sources are coupled to the same current adjusting element.

An embodiment of the invention will now be described, by way of example, with reference to the accompanying drawing the single FIGURE of which is a circuit diagram of a preferred embodiment.

Referring now to the FIGURE, the inputs of the first differential current source are formed by the bases of input transistors $T_0$ and $T'_0$. The emitter of the transistor $T'_0$ is connected to its collector via the series connection of the emitter collector path of a transistor $T'_2$ and the collector base path of a transistor $T'_4$. The collector of the transistor $T'_2$ is connected to its base via the series connection of the base emitter paths of transistors $T'_3$ and $T'_1$. The collectors of the transistors $T'_1$ and $T'_3$ are jointly connected to an output $P'_1$ of a first differential current source, which output is connected to a first supply point (+) via a high-resistance current source comprising transistors $T'_7$ and $T'_8$ and a resistor $R'_3$. The emitters of the transistors $T'_0$ and $T'_2$ are connected to the base of the transistor $T'_2$ via the base-collector path of a transistor $T'_5$. The emitter of the transistor $T'_5$ is connected to a second supply point (−) via a high-resistance current source comprising a transistor $T'_6$ and a resistor $R'_1$. The assembly of the transistors $T'_0$, $T'_1$, $T'_2$, $T'_3$, $T'_4$, $T'_5$ and $T'_6$ and the resistor $R'_1$ behaves as an equivalent npn-transistor. The base of the transistor $T'_0$ also is the base of this equivalent transistor. The base of the transistor $T'_2$ forms the emitter, and the collector of the transistor $T'_1$ forms the collector, of the said equivalent transistor. Similarly a circuit comprising transistors $T_0$, $T_1$, $T_2$, $T_3$, $T_4$, $T_5$ and $T_6$ and a resistor $R_1$ forms an equivalent npn-transistor. The base of the transistor $T_0$ also is the base of the equivalent transistor. The base of the transistor $T_2$ also is the emitter of the equivalent transistor, and the collector of the transistor $T_1$ also is the collector of the equivalent transistor, which equivalent transistor is connected to the first supply point (+) via a high-resistance current source comprising transistors $T_7$ and $T_8$ and a resistor $R_3$. The emitters, $g_2$ and $g'_2$, of the two equivalent npn-transistors are interconnected via a gyration resistor $G_2$.

The inputs of the second differential current source are formed by the bases of transistors $T_{11}$ and $T'_{11}$. The collector of the input transistor $T_{11}$ is connected to the base of a transistor $T_{13}$ via the emitter collector path of a transistor $T_{12}$. The emitter of the transistor $T_{13}$ also is an output of the second differential current source and is connected to the emitter of the input transistor $T_{11}$ via the main current path of the transistor $T_{13}$. The collector of the input transistor $T_{11}$ is connected to the first supply point (+) via a high-resistance current source comprising transistors $T_9$ and $T_{10}$ and a resistor $R_4$. The emitter of the transistor $T_{13}$ is connected, via the collector emitter path of a transistor $T_{14}$, which is connected to a high-resistance current source comprising a transistor $T_{18}$ and a resistor $R_2$, to the second supply point (−). The base of the transistor $T_{14}$ is connected to the base of the transistor $T_{13}$ via a diode $D_3$. A semiconductor diode $D_4$ is connected in parallel with the collector emitter path of the transistor $T_{14}$. The base of the transistor $T_{12}$ is connected via a diode $D_2$ to the emitter of the transistor $T_{11}$, and the base of the transistor $T_{11}$ is connected to its emitter via a diode $D_1$. The assembly comprising the transistors $T_9$, $T_{10}$, $T_{11}$, $T_{12}$ and $T_{13}$, the diodes $D_1$ and $D_2$ and the resistor $R_4$ behaves as an equivalent pnp-transistor. The base of the input transistor $T_{11}$ also is the base of this equivalent transistor. The emitter of the input transistor $T_1$ also is the emitter of the equivalent transistor, and the emitter of the transistor $T_{13}$ also is the collector of the equivalent transistor. The assembly comprising transistors $T'_9$, $T'_{10}$, $T'_{10}$, $T'_{11}$, $T'_{12}$ and $T'_{13}$, diodes $D'_1$ and $D'_2$ and a resistor $R'_4$ also behaves as an equivalent pnp-transistor and is identical in structure to the afore-described equivalent pnp-transistor. The emitter of the transistor $T'_{14}$ is connected through a diode $D'_5$ to a terminal *c*. A terminal *d* is connected via a diode $D_8$ to a high-resistance current source comprising a transistor $T'_{18}$ and a resistor $R'_2$. The emitters $g_1$ and $g'_1$ of the two equivalent transistors are interconnected via a gyration resistor $G_1$. Moreover, the base of the transistor $T'_0$ is connected to the emitter of the transistor $T_{13}$, and the base of the transistor $T_0$ is connected to the emitter of the transistor $T'_{13}$. The terminal *c* is also connected to the emitter of the transistor $T_5$ via a diode $D_7$.

Transistors $T_{15}$ and $T_{16}$, diode $D_{10}$, resistor $R_5$ and terminal *a* form part of a current adjusting element common to all the high-resistance current sources. A resistor R the value of which may be varied in accordance with the desired current, is connected between the terminal *a* and a point of constant potential. The terminal *a* is connected to the first supply point (+) via the series combination of the emitter collector path of the transistor $T_{16}$ and the resistor $R_5$. The terminal *a* is also connected via the diode $D_{10}$ to the base of the transistor $T_{15}$. The base of the transistor $T_{16}$ is connected to its collector via the collector emitter path of the transistor $T_{15}$. The control electrodes of all the high-resistance current sources ($T_7$, $T_8$), ($T'_7$, $T'_8$), ($T_9$, $T_{10}$) and ($T'_9$, $T'_{10}$) that are connected to the first supply point (+) are connected to the base of the transistor $T_5$ of the current adjusting element. The control electrodes of all the high-resistance current source $T'_6$, $T'_{18}$, $T_6$ and $T_{18}$ that are connected to the second supply point (−) are connected to a point of constant potential via the emitter collector path of a transistor $T_{19}$ and a terminal *b*. The emitter of the transistor $T_{19}$ is also connected, via the series combination of a diode $D_9$ and a resistor $R_6$, to the second supply point (−). The base of the transistor $T_{19}$ is connected to the collector of the transistor $T'_{18}$. At least one diode D may be connected between terminals *c* and *d*, the number of diodes being dependent upon the value of the desired voltage drive of the gyrator. As an alternative, the terminals *c* and *d* may be short-circuited.

The use of the equivalent pnp-transistors in the second differential current source has the advantage of increasing the exactitude of the voltage-to-current conversion, as is described in co-pending Patent application No. 218,389 filed Jan. 17, 1972. If a signal voltage V is applied between input terminals $P_1$ and $P'_1$ of this differential current source, the gyration resistor $G_1$ will be traversed by a signal current which is equal to $$i = (V - 2\,\Delta\, V_{bE}/G_1) \text{ amperes} \tag{1}$$

where $G_1$ is the resistance value of the gyration resistor and $\Delta\, V_{bE}$ is the base emitter signal voltage of the two input transistors $T_{11}$ and $T'_{11}$. The output signal currents at the emitters of the transistors $T_{13}$ and $T'_{13}$ will be equal to $$i_c = i - i_{bo} \tag{2}$$

where $i_{bo}$ is the base signal current of each of the two transistors $T_{11}$ and $T'_{11}$. The latter input signal currents are equal to $i_b/\beta$, where $i_b$ is the value of the currents which flow through the main current paths of the input transistors $T_{11}$ and $T'_{11}$ and via the current feedback paths formed by the main current paths of the transistors $T_{12}$ and $T'_{12}$ respectively to the bases of the transistors $T_{13}$ and $T'_{13}$ respectively, whilst $\beta$ is the base collector current gain factor of the transistors $T_{11}$, $T'_{11}$, $T_{13}$ and $T'_{13}$. Thus the input signal currents are about equal to $$i_{bo} \approx i_{c/\beta^2}$$

This means that the base collector current gain factor of the two equivalent pnp transistors is about equal to $\beta^2$. Because the signal current which flows through the main current paths of the two input transistors $T_{11}$ and $T'_{11}$ is small, the base emitter signal voltage $\Delta\, V_{bE}$ of these transistors will also be small. Because the input signal currents and the base emitter signal voltages of the two transistors are reduced in comparison with the use of a normal transistor, the voltage-to-current conversion will be more accurate.

The use of the equivalent npn transistors in the first differential current source also has the advantage of increasing the accuracy of the voltage-to-current conversion. If a signal voltage of V volts is applied between the input terminals $P_2$ and $P'_2$ of this differential current source, the gyration resistor $G_2$ will be traversed by a = which is equal to $$i = (V - 2\,\Delta\, V_{bE}/G_2) \text{ amperes} \tag{3}$$

where $G_2$ is the resistance value of the gyration resistor and $\Delta\, V_{bE}$ is the signal voltage between the points $P_2$ and $G_2$ and between the points $P'_2$ and $G'_2$. The output currents at the two inputs $P_1$ and $P'_1$ of the differential current source will be substantially equal to $$i_c = i - i_{bo} \tag{4}$$

where $i_{bo}$ is equal to the input signal current of each the two input transistors $T_0$ and $T'_0$. The latter input signal currents are approximately equal to $$i_{bo} - (i/\beta_p \cdot \beta^3) \tag{5}$$

where $\beta_p$ is the base collector current gain factor of the pnp-transistors $T_4$ and $T'_4$ and $\beta$ is the base collector current gain factor of the transistors $T_0$, $T_1$, $T_3$, $T'_0$, $T'_1$ and $T'_3$. The relation 5 shows that the base collector current gain factors of the two equivalent npn transistors are approximately equal to $$\beta_N = \beta_p \cdot \beta^2 \tag{6}$$

Because the signal currents which flow through the main current paths of the two input transistors $T_0$ and $T'_0$ and of the transistors $T_2$ and $T'_2$ are small, the base emitter signal voltage $\Delta V_{bE}$, see relation 3, will also be small. Because the input signal currents and the base emitter signal voltages of the two input transistors are reduced, voltage-to-current conversion will be more accurate.

The fact that the first group of high-resistance current sources connected to the first supply point (+) is adjusted by means of the current adjusting element and the fact that the second group of high-resistance current sources is adjusted, via the second differential current source, by the first group result in a highly accurate known relationship between the currents of the two groups. This ensures that the D.C. offset currents at the input and the output of the gyrator can be reduced. For this purpose additional transistors $T'_{20}$, $T_{20}$ and $T_{21}$ are provided. The current adjusting element determines the currents flowing through the resistors $R_3$, $R'_3$, $R_4$ and $R'_4$, which currents are equal. The high-resistance current sources which include the resistors $R_4$ and $R'_4$ are coupled via the second differential current source to the high-resistance current sources which include the resistors $R_2$ and $R'_2$, the coupling being such that no voltage offset is produced across the gyration resistor $G_1$. Thus the currents through $R_2$ and $R'_2$ are fixed and hence so are the currents through the resistors $R_1$ and $R'_1$. The currents through $R_3$ and $R'_3$ had already been fixed. The said transistors are also provided to ensure that no voltage offset is produced across the gyration resistor $G_2$.

The outputs $P_2$ and $P'_2$ are coupled to the main current paths of the respective transistors $T_{14}$ and $T'_{14}$ the bases of which are connected via semiconductor diodes to the bases of the respective transistors $T_{13}$ and $T'_{13}$. This is because the bases of the transistors $T_{13}$ and $T'_{13}$ are highly sensitive to capacitive leakage currents, which are of the same order of magnitude as the base direct currents of these transistors, especially at high frequencies, and which limit the drive of the equivalent transistors. In view of the capacitive leakage currents the transistors $T_{14}$ and $T'_{14}$ and the diodes $D_3$ and $D'_3$ supply additional base direct currents to the main current paths of the transistors $T_{13}$ and $T'_{13}$.

The outputs $P_2$ and $P'_2$ are also connected to the diodes $D'_4$ and $D_4$ respectively. The reason for this arrangement is that at high signal drive the transistors $T_{13}$ and $T'_{13}$ are liable to become cut off, so that the potentials at the two outputs are no longer defined. As a result the gyrator no longer operates correctly. The provision of the said diodes ensures that the potentials at the points $P_2$ and $P'_2$ are always defined.

The diode $D_7$ is included in the gyrator to ensure that the gyrator when connected into circuit will always operate as a gyrator.

The gyrator according to the invention may simply be manufactured in integrated-circuit form, the terminals *a*, *b*, *c*, *d*, $P_1$, $P_2$, $P'_1$, $P'_2$, $G_1$, $G_2$, $G'_1$ and $G'_2$ and the first and second supply points taking the forms of bonding pads for external connection on the semiconductor body. Furthermore field-effect transistors may be used instead of bipolar transistors.

What is claimed is:

1. Gyrator which comprises a first and a second voltage-controlled differential current source, which current sources each include two input transistors and have two outputs, the control electrodes of the input transistors of the first differential current source also forming the inputs of the gyrator, whilst the control electrodes of the input transistors of the second differential current source also form the outputs of the gyrator, each of the outputs of the first differential current source being connected to an output of the gyrator, whilst each of the outputs of the second differential current source is connected to an input of the gyrator, at least one of the two inputs and both outputs of the gyrator being connected via high-resistance current sources to points of constant potential whilst each of the input transistors has a first and a second main electrode, characterized in that, at least in the second differential current source, a high-resistance current source is connected in each of the circuits between the first main electrodes of the two input transistors and a supply point, whilst each of the first main electrodes is connected via a current feedback path to the control electrode of a first transistor the main current path of which is connected in the circuit between the second main electrode of an input transistor and another supply point, the two outputs of the differential current source each being connected via the main current path of at least one auxiliary transistor to the second main electrode of the respective input transistor the main current path of which also forms part of the said circuit between the second main electrode of the respective input transistor and another supply point, means being provided to couple all the said high-resistance current sources to the same current adjusting element.

2. Gyrator as claimed in claim 1, characterized in that in the second differential current source the first main electrode of each of the input transistors is the collector and the second main electrode of the respective transistor is the emitter, the collector of each of the input transistors being connected via the emitter collector path of a second transistor to the base of the first transistor, which transistor also is the auxiliary transistor, the emitter of the first transistor, which emitter also forms an output of the second differential current source, being connected via the collector emitter path of a transistor to the respective high-resistance current source, whilst the base of the latter transistor is connected via at least one semiconductor diode to the base of the first transistor, at least one semiconductor diode being connected in parallel with the collector emitter path of the latter transistor.

3. Gyrator as claimed in claim 1, characterized in that the emitters of the input transistors of the first differential current source are each connected via the series combination of the emitter collector path of the first auxiliary transistor and the collector base path of a second auxiliary transistor to the collector of the respective input transistor, the collectors of the first auxiliary transistors each being connected via the base emitter path of at least one third auxiliary transistor to the base of the respective first auxiliary transistor, whilst the collector of the third auxiliary transistor is connected to an output of the first differential current source.

* * * * *